United States Patent
Chiang

(10) Patent No.: US 6,295,016 B1
(45) Date of Patent: *Sep. 25, 2001

(54) PIPELINE ANALOG TO DIGITAL (A/D) CONVERTER WITH RELAXED ACCURACY REQUIREMENT FOR SAMPLE AND HOLD STAGE

(75) Inventor: Meei-Ling Chiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/506,208

(22) Filed: Feb. 17, 2000

(51) Int. Cl.[7] ....................................................... H03M 1/38
(52) U.S. Cl. .......................... 341/161; 341/155; 341/162
(58) Field of Search ................................... 341/118, 122, 341/166, 155, 162

(56) References Cited

U.S. PATENT DOCUMENTS

| | | | |
|---|---|---|---|
| 4,633,223 | * 12/1986 | Senderowicz | 341/118 |
| 4,994,808 | 2/1991 | Wichelman | 341/161 |
| 5,157,398 | * 10/1992 | Okazaki et al. | 341/161 |
| 5,465,093 | 11/1995 | Kusumoto et al. | 341/122 |
| 5,534,864 | 7/1996 | Ono et al. | 341/155 |
| 5,541,602 | 7/1996 | Opris et al. | 341/161 |
| 5,572,212 | 11/1996 | Levinson et al. | 341/162 |
| 5,635,937 | 6/1997 | Lim et al. | 341/161 |
| 5,710,563 | 1/1998 | Vu et al. | 341/161 |
| 5,861,832 | 1/1999 | Nagaraj | 341/161 |
| 5,870,041 | * 2/1999 | Lee et al. | 341/118 |
| 5,874,912 | 2/1999 | Hasegawa | 341/161 |

OTHER PUBLICATIONS

U.S. application No. 09/506,316, filed Feb. 17, 2000, claims 1 to 36.
U.S. application No. 09/506,284, filed Feb. 17, 2000, claims 1 to 27.
U.S. application No. 09/506,037, filed Feb. 17, 2000, claims 1 to 12.
A Pipelined 5–Msample/s 9–bit Analog–to–Digital Converter, Stephen H. Lewis and Paul R. Gray, IEEE Journal of Solid–State Circuits, vol. Sc–22, No. 6, Dec. 1987, 954–961.
A 10–b 20–Msample / s Analog–to–Digital Converter, Stephen H. Lewis, H. Scott Fetterman, et al., IEEE Journal of Solid–State Circuits, vol. 27, No. 3, Mar. 1992, 351–358.
A 10 b, 20 Msample/s, 36 mW Pipeline A/D Converter, Thomas Byunghak Co and Paul R. Gray, IEEE Journal of Solid–State Circuits, vol. 30, No. 3, Mar. 1995, 166–172.
A 250–mW, 8–b, 52–Msamples/s Parrellel–Pipelined A/D Converter with Reduced Number of Amplifiers, IEEE Journal of Solid–State Circuits, vol. 32, No. 3, Mar. 1997, 312–320.
A 13–b 2.5–Mhz Self–Calibrated Pipelined A/D Converter in 3–μm CMOS, Uyh–Min Lin, et al., IEEE Journal of Solid–State Circuits, vol. 26, No. 4, Apr. 1991, 628–636.

* cited by examiner

Primary Examiner—Peguy JeanPierre
Assistant Examiner—Jean Bruner Jeanglaude
(74) Attorney, Agent, or Firm—Renner, Otto, Boisselle & Sklar, LLP

(57) ABSTRACT

A pipeline analog to digital (A/D) converter for converting an analog input signal into a digital representation of the analog signal. The pipeline A/D converter has a sample and hold stage, the sample and hold stage sampling and holding the analog input signal and outputting a sampled and held signal. The pipeline A/D converter also has a first analog signal converter stage, the first analog converter stage producing a digital output based on the sampled and held signal, from which a most significant bit of the digital representation of the analog input signal is derived. The first analog converter stage produces a residue signal based on a comparison of the analog input signal and an analog representation of the digital output. The pipeline A/D converter has at least one additional stage, the additional stage producing a subsequent digital output based on the residue signal produced by the first analog signal converter stage, at least one bit which is less significant than the most significant bit being derived from the subsequent digital output.

17 Claims, 6 Drawing Sheets

PIPELINE ANALOG TO DIGITAL (A/D) CONVERTER WITH RELAXED ACCURACY REQUIREMENT FOR SAMPLE AND HOLD STAGE

TECHNICAL FIELD

The present invention generally relates to pipeline analog to digital (A/D) converters and, more particularly, to circuit and timing at the initial stages of the pipeline A/D converters.

BACKGROUND

There is an ever present demand for analog to digital (A/D) converters that accurately convert an analog voltage signal into a digital representation. There is also a need for faster A/D converters that use less power and have smaller areas on an integrated circuit. Oftentimes, a conventional A/D converters sacrifice accuracy in favor of meeting speed, power consumption and size demands.

FIG. 1 illustrates a conventional pipeline analog to digital (A/D) converter 10. The A/D converter 10 converts an analog electrical input signal ($V_{IN}$) into a digital representation of the analog signal ($D_{OUT}$) The illustrated example is a 4-bit A/D converter, but it should be understood that a resolution of more or less bits may be implemented with the addition or removal of converter stages. Therefore, the resolution of the A/D converter will sometimes be referred to an N-bit A/D converter, where N represents the number of digital output bits. The A/D converter 10 has an analog signal input 12 provided on an initial stage. The initial stage is a sample-and-hold amplifier (SHA) 14. The SHA 14 samples the analog input signal and holds the sampled voltage, or $V_{s/h}$, for the next stage of the pipeline A/D converter 10 at an SHA output 16. The stage following the SHA 14 is a multiplying digital to analog converter (MDAC) 18. MDAC 18 stages are added to the pipeline to increase the number of output bits.

With additional reference to FIG. 2, each MDAC 18 has an analog input 20 and an analog output 22. Each MDAC 18 performs analog to digital conversion of an MDAC input signal, $V_I$, applied to the analog input 20. Each MDAC 18 also calculates an amplified residue signal, $V_{res}$, which is output for the next stage at the analog output 22. The number of MDAC 18 stages is determined by the desired resolution of the A/D converter 10, or the value of N. The number of MDAC 18 stages is equal to N minus two. In the example, the resolution is four bits. Therefore there are two MDAC 18 stages, referred to as MDAC, (reference numeral 24) and MDAC$_2$ (reference numeral 26). The SHA output 16 is connected to the analog input 20 of MDAC$_1$. The analog output 22 of MDAC$_1$ is connected to the analog input 20 of MDAC$_2$. Therefore, the $V_I$ of each MDAC 20, other than MDAC$_1$ which receives $V_{s/h}$, is the $V_{res}$ of the preceding MDAC 18, also referred to herein as $V_{resm}$ where m stands for the MDAC 18 generating the output signal.

The analog output 22 of the last MDAC 18, which is MDAC$_2$ in the example, is connected to an input 28 of a last stage 30. The last stage 30, which will be discussed in more detail below, has no analog output.

Each MDAC 18 and the last stage has two digital outputs 32, 34 for providing one bit of resolution and one bit for correcting error. The bits are generically referred to as $b_1$ and $b_0$ or, for a specific MDAC 18, are referred to as $b_{m1}$ and $b_{m0}$ where m stands for the MDAC 18 generating the output signal or the last stage 30. It is noted that MDAC$_1$ generates $b_{11}$ and $b_{10}$ with some degree of error, MDAC$_2$ generates $b_{21}$ and $b_{20}$ with some degree of error and so forth. With additional reference to FIG. 4, the last stage 30 of the illustrative four bit A/D converter 10 generates $b_{3}$ and $b_{31}$ where $b_{30}$, is the least significant bit (LSB) and $b_3$ is used to correct error generated by MDAC$_2$ by adding $b_{31}$ and $b_{20}$. As illustrated, $b_{21}$ is added to $b_{10}$ to correct error generated by MDAC$_1$. In general, therefore, $b_{m1}$ is used to correct the error generated by MDACm$_{m-1}$.

Still referring to FIGS. 1 and 2, each MDAC 18 has a 1.5 bit analog to digital converter (ADC) 36 for generating $b_1$ and $b_0$ from $V_I$. Table 1 is a definition table for the values of $b_1$ and $b_0$ with respect to $V_I$ for the MDAC 18. It is noted that $\pm V_r$ is the full scale range of the ADC 36.

TABLE 1

| Input Voltage Range ($V_I$) | $b_1$ | $b_0$ |
|---|---|---|
| $V_I < -V_r/4$ | 0 | 0 |
| $-V_r/4 < V_I < +V_r/4$ | 0 | 1 |
| $V_I > +V_r/4$ | 1 | 0 |

Once $b_1$ and $b_0$ are generated by the ADC 36 they are output at digital outputs 32, 34 and also input into a 1.5 bit digital to analog converter (DAC) 38. The DAC 38 converts $b_1$ and $b_0$ into an analog signal, or $V_{DAC}$, used in the calculation of $V_{res}$. Table 2 is a definition table for the value of $V_{DAC}$ with respect to $b_1$ and $b_0$ for the MDAC 18.

TABLE 2

| $b_1$ | $b_0$ | $V_{DAC}$ |
|---|---|---|
| 0 | 0 | $-V_r/2$ |
| 0 | 1 | 0 |
| 1 | 0 | $+V_r/2$ |

The MDAC 18 generates $V_{res}$ by subtracting $V_{DAC}$ from $V_I$ with an adder 40 and amplifying the summed value with an amplifier 42 having a gain of two. With additional reference to FIG. 3, the characteristics of the MDAC 18 are illustrated. FIG. 3 graphs $V_I$ versus $V_{res}$ and illustrates the values of $b_1$ and $b_0$ over the range of values for $V_I$.

The last stage 30 is a two bit analog to digital converter (ADC) for converting the last stage's input voltage, $V_I$, into a two bit digital value. Therefore, similar to the MDACs 18, the last stage has two digital outputs 32, 34 respectively providing $b_1$ and $b_0$. The $b_0$ provided at the second digital output 34 for the last stage 30 represents the least significant bit of the digital output of the A/D converter 10. Alternatively, the last stage 30 can be implemented with an MDAC 18 without connecting the output 22 to any other stage. Table 3 is a definition table for the values of $b_1$ and $b_0$ with respect to $V_I$ for the two bit last stage 30.

TABLE 3

| Input Voltage Range ($V_I$) | $b_1$ | $b_0$ |
|---|---|---|
| $V_I < V_r \cdot \frac{3}{4}$ | 0 | 0 |
| $-V_r \cdot \frac{3}{4} < V_I < -V_r/4$ | 0 | 1 |
| $-V_r/4 < V < +V_r/4$ | 1 | 0 |
| $V_I > +V_r/4$ | 1 | 1 |

The digital outputs of the MDACs 18 and the last stage 30 are input into a digital logic correction circuit 44. The digital logic correction circuit 44 generates the digital output, $D_{OUT}$, of the A/C converter 10. The digital output is a series of bits, or $D_{N-1}$ to $D_0$. In the example, N is four bits.

Therefore, the digital output is $D_3$, $D_2$, $D_1$ and $D_0$ where $D_3$ is the most significant bit (MSB) and $D_0$ is the least significant bit (LSB). The digital logic correction circuit 44 corrects error caused by inaccurate thresholds in the 1.5 bit ADC 36 of the MDACs 18 and the two bit ADC of the last stage 30. As long as the individual thresholds deviate no more than $V_r/4$ from an ideal value, then the error can be corrected by adding shifted digital outputs of each of the stages.

FIG. 4 depicts a shifting operation of the digital error correction circuit 44. It is noted that S is the number of stages of the A/D converter 10 excluding the SHA 14 and the last stage 30. In other words, S is the number of MDACs 18 in the pipeline A/D converter 10.

FIG. 5 is a graph of the characteristics of the 4-bit A/D converter 10 illustrated in FIG. 1, under the condition that the thresholds for the 1.5 bit ADC 36 of the MDACs 18 and the 2 bit ADC of the last stage 30 deviate no more than $V_r/4$. It is noted that $\pm V_R$ is the full scale range of the A/D converter 10. It is also noted that an analog input voltage of zero volts is defined as the center of digital 1000. However, if the thresholds of the two bit ADC of the last stage 30 are $+V_r*3/4$, $+V_r/4$ and $-V_r/4$, rather than the thresholds shown in Table 3, the A/D conversion curve illustrated in FIG. 5 will move one LSB to the right resulting in analog input voltage of zero volts being defined as the center of digital 0111.

Referring to FIGS. 2 and 13, the timing of the A/D converter 10 will be discussed. The A/D converter 10 has a bias and reference generator (not shown) and a clock generator (not shown). The bias and reference generator generates appropriate bias currents and voltage references for use by the various stages of the A/D converter 10. The clock generator generates a two phase non-overlapping clock signal, the respective clock pulse signals of which are referred to as CLK1 and CLK2. Waveforms for the two clock pulse signals, CLK1 and CLK2, are illustrated in the top portion of FIG. 13. CLK1 effectively has about a 50% duty cycle. CLK2 also effectively has about a 50% duty cycle but lags CLK1 by 180°.

As illustrated in FIG. 2, CLK1 is applied to a sample clock input SA of the SHA 14 and a hold clock input H of the amplifier 42 of MDAC$_1$. CLK2 is applied to a hold clock input H of the SHA 14, a latch clock input L of the ADC 36 of MDAC$_1$ and a sample clock input SA of the amplifier 42 of MDAC$_1$. As indicated by FIG. 13, the same clock signals are used for MDAC$_2$, :2.1 but the clock signals are alternated. More specifically, CLK1 is applied to the latch clock input L of the ADC 36 of MDAC$_2$ and the sample clock input SA of the amplifier 42 of MDAC$_2$ and CLK2 is applied to the hold clock input H of the amplifier 42 of MDAC$_2$. If additional MDAC 18 stages are present for a higher resolution A/D converter IO, the third and subsequent MDACs 18 alternately use CLK1 and CLK2 for the sample/latch operation and the hold operation so that the sample/latch of the MDAC 18 coincides with the hold of the previous MDAC 18. CLK2 is applied to a latch clock input of the last stage 30. It is noted that the last stage 30 does not conduct sample and/or hold operations since the last stage 30 does not generate a residue output.

The sample, hold and latch operations of the SHA stage 14, MDAC$_1$, MDAC$_2$, and the last stage 30 are illustrated in the bottom portion of FIG. 13. The different shading in the timing diagram represents the pipeline conversion process on a series of two analog input samples as the samples pipeline through all of the stages. The SHA 14 samples the analog input signal, $V_{IN}$, during CLK1 and conducts a hold operation during CLK2. MDAC$_1$ samples $V_{s/h}$ during CLK2. The ADC 36 of MDAC$_1$ operates during the pulse of CLK2 and preferably latches the digital output on the falling edge of CLK2, thereby giving $V_{s/h}$ time to settle to the analog equivalent of N bit accuracy. Therefore, the tolerance of the SHA 14 is the analog equivalent of one LSB. MDAC$_1$ generates and holds the residue output $V_{res1}$ during CLK1. MDAC$_2$ samples $V_{res1}$ during CLK1 and latches its digital output at the end of CLK1, or on the falling edge of CLK1, thereby giving $V_{res}$ time to settle to the analog equivalent of N–1 bit accuracy. MDAC$_2$ generates and holds $V_{res2}$ during CLK2. The last stage 30 latches its digital output at the end of CLK2, or on the falling edge of CLK2, thereby giving $V_{res2}$ time to settle to the analog equivalent of N–2 bit accuracy.

Should additional information be desired regarding conventional pipeline A/D converters, attention is directed to Stephen H. Lewis et al., "A Pipelined 5-Msample/s 9-bit Analog-to-Digital Converter," IEEE J. Solid-State Circuits, vol. Sc-22, no. 6, pages 954–961, December 1987; Stephen H. Lewis et al., "A 10-b 20-Msample/s Analog-to-Digital Converter," IEEE J. Solid-State Circuits, vol. 27, no. 3, pages 351–358, March 1992; Thomas B. Cho et al., "A 10 b, 20 Msample/s, 35 mW Pipeline A/D Converter," IEEE J. Solid-State Circuits, vol. 30, no. 3, pages 166–172, March 1995; Krishnaswamy Nagaraj et al., "A 250-mW, 8-b, 52-Msample/s Parallel-Pipelined A/D Converter with Reduced Number of Amplifiers, " IEEE J. Solid-State Circuits, vol. 32, no. 3, pages 312–320, March 1997; and Yuh-Min Lin et al., "A 13-b 2.5-MHZ Self-Calibrated Pipelined A/D Converter in 3-$\mu$m CMOS, " IEEE J. Solid-State Circuits, vol. 26, no. 4, pages 628–636, April 1991, each of which are incorporated by reference in their entireties.

There is an ever present demand for A/D converters that accurately convert an analog voltage signal into a digital representation. An N bit A/D converter properly converts an analog voltage signal into a digital representation with N bit accuracy if the converter satisfies maximum differential non-linearity (DNL) and integral non-linearity (fNL) requirements. To achieve N bit resolution by the pipeline A/D converter structure exemplified in FIG. 1, $V_{s/h}$ needs to have the analog equivalent of N bit accuracy, $V_{res1}$ needs to have the analog equivalent of N–1 bit accuracy, $V_{res2}$ needs to have the analog equivalent of N–2 bit accuracy and so forth. However, it is difficult to achieve such accuracy for A/D converters having a high sampling rate (e.g., 25 MHZ and up) and a large number of output bits (e.g., N=8 and up).

SUMMARY OF THE INVENTION

The present invention provides a pipeline analog to digital (A/D) converter for converting an analog input signal into a digital representation of the analog signal. The pipeline A/D converter has a sample and hold stage, the sample and hold stage sampling and holding the analog input signal and outputting a sampled and held signal. The pipeline A/D converter also has a first analog signal converter stage, the first analog converter stage producing a digital output based on the sampled and held signal, from which at least a most significant bit of the digital representation of the analog input signal is derived The first analog converter stage produces a residue signal based on a comparison of the analog input signal and an analog representation of the digital output. The pipeline A/D converter has at least one additional stage, the additional stage producing a subsequent digital output based on the residue signal produced by the first analog signal converter stage, at least one bit which is less significant than the most significant bit being derived from the subsequent digital output.

According to another aspect of the invention, the pipeline analog to digital converter has a sample and hold stage. The sample and hold stage has an input and an output. The sample and hold stage input is connected to receive an analog input signal. The pipeline analog to digital converter also has an analog signal converter stage. The analog signal converter stage has a sample-and-hold voltage input, an analog signal input, a digital output, and a residue output. The sample-and-hold voltage input is connected to the output of the sample and hold stage and the analog signal input is connected to receive the analog input signal. The analog input signal is used to generate a residue output signal.

BRIEF DESCRIPTION OF DRAWINGS

These and further features of the present invention will be apparent with reference to the following description and drawings, wherein.

DISCLOSURE OF INVENTION

Figure 1:
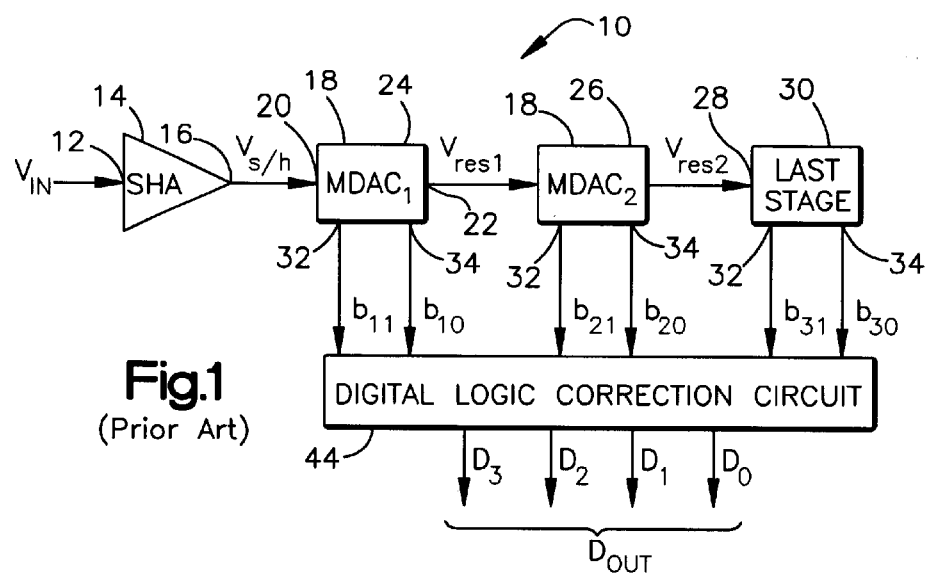
FIG. 1 is a block diagram of a conventional 4-bit pipeline analog to digital (A/D) converter.

In the detailed description which follows, identical components have been given the same reference numerals, regardless of whether they are shown in different embodiments of the present invention. In order to clearly and concisely illustrate the present invention, the drawings may not necessarily be to scale and certain features may be shown in somewhat schematic form.

Figure 6:
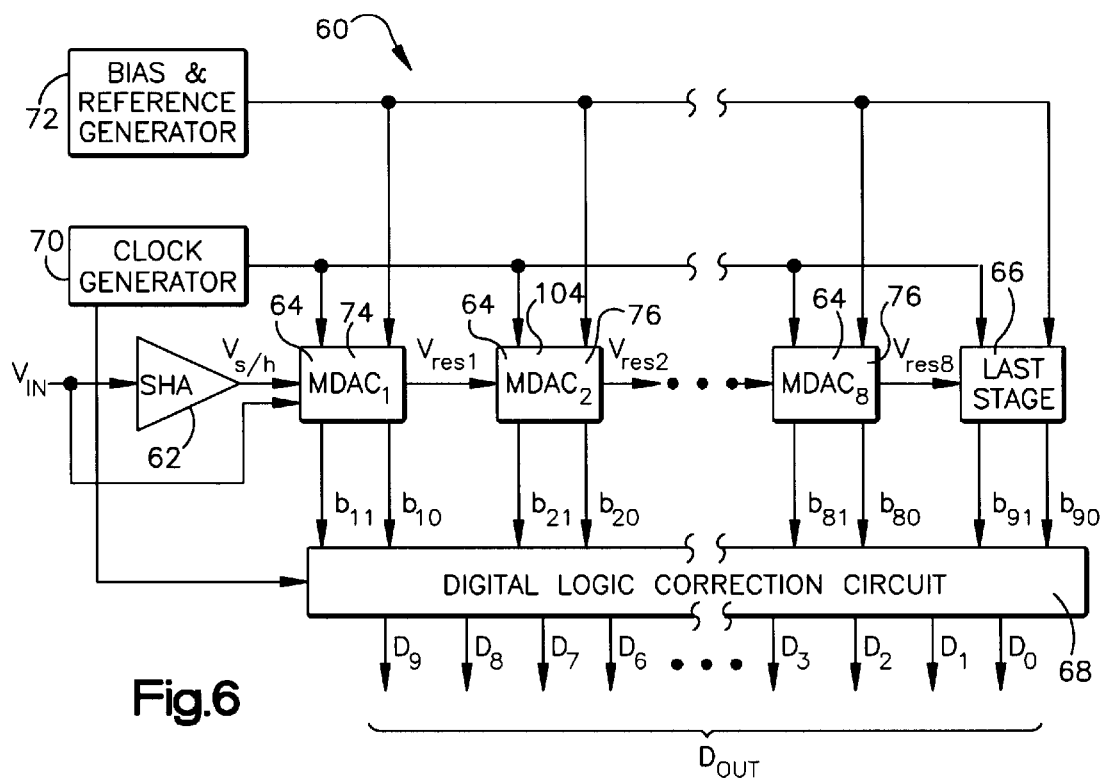
FIG. 6 is a block diagram of a 10-bit pipeline A/D converter according to the present invention.

Referring to FIG. 6, an analog to digital (A/D) converter 60 according to the present invention is illustrated. The A/D converter 60 converts an analog electrical input signal ($V_{IN}$) into a digital representation of the analog signal ($D_{OUT}$) The illustrated example is a 10-bit A/D converter, but it should be understood that a resolution of more or less bits is easily implemented with the addition or removal of converter stages. Therefore, the resolution of the A/D converter will sometimes be referred to as an N-bit-A/D converter, where N represents the number of digital output bits. The illustrated example A/D converter 60 has a sampling rate of 40 MHZ. Other sampling rates, such as 25–250 Mhz, can also be used.

Similar to the A/D converter 10 illustrated in FIG. 1, the A/D converter 60 has a sample-and-hold amplifier (SHA) 62, a series of analog signal converter stages also referred to as multiplying digital to analog converters SAC) 64 labeled $MDAC_1$ through $MDAC_8$, or generically $MDAC_m$, a last stage 66, and a digital logic correction circuit 68. In addition, the A/D converter 60 is provided with a clock generator 70 and a bias and reference voltage generator 72. The bias and reference generator 72 generates appropriate bias currents and voltage references for each of the various stages of the A/D converter 60. The clock generator 70 generates four clock pulse signals, referred to herein as a first clock pulse signal, or CLKA, a second clock pulse signal, or CLKB, a third clock pulse signal, or CLK1, and a fourth clock pulse signal, or CLK2. The clock generator 70 also generates early-falling versions of these clock pulse signals, referred to herein as CLKA', CLKB', CLK1' and CLK2'. The load and :) driving ability of all of the clock lines are preferably the same so as to help maintain the non-overlapping characteristic of the clock signals. The timing of the A/D converter 60 is discussed in more detail below. $MDAC_1$ (reference numeral 74) has a different configuration than $MDAC_2$ through $MDAC_m$ (reference numeral 76). $MDAC_2$ through $MDAC_m$ each have the same configuration.

Figure 7:
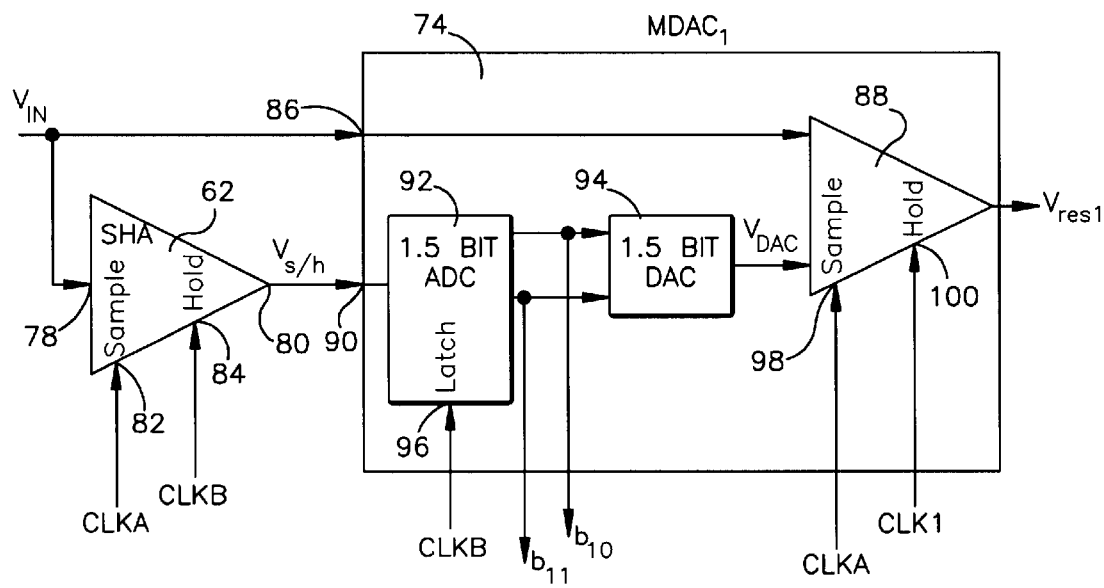
FIG. 7 is a block diagram of a sample-and-hold amplifier (SHA) stage and a first multiplying digital to analog converter (MDAC) according to the present invention.

With reference to FIG. 7, the general operation of the A/D converter 60 will be described.

Specific details of the A/D converter 60 operation will be discussed in greater detail below. It is noted, however, that the digital output of the MDACs as illustrated and described is exemplary and MDACs having resolution higher or lower than 1.5 bits is intended to fall within the scope of the present invention. $MDAC_1$ uses $V_{s/h}$ to generate $b_{11}$ and $b_{10}$. However, $MDAC_1$ does not use $V_{s/h}$ directly in a residue calculation. Rather, $MDAC_1$ uses $V_{IN}$ directly in the residue calculation operation. Since $V_{s/h}$ does not participate directly in the residue calculation, $V_{s/h}$ does not require the analog voltage equivalent of N-bit accuracy. This means that the tolerance of the SHA 62 can be greater than one LSB. In other words, $V_{s/h}$ has a relaxed accuracy requirement. As will be more fully explained below, if any error contained in $V_{s/h}$ plus the threshold offset of the ADC of $MDAC_1$ is kept within $V_r/4$, then the digital correction logic circuit 68 can recover a valid $D_{OUT}$. It is noted that the residue output of $MDAC_1$ should be accurate within the analog equivalent of N–1 bits. However, the difficult to achieve N bit accuracy of the SHA 62 has been eliminated, thereby helping to increase A/D converter 60 speed, reduce power consumption and reduce integrated circuit size requirements while also maintaining the overall accuracy of the A/D converter 60.

With continued reference to FIG. 7, the SHA 62 and $MDAC_1$ will be discussed in greater detail. The SHA 62 preferably has unity gain. $V_{IN}$ is input into an analog signal input 78 of the SHA 62. The SHA 62 samples the analog input signal ($V_{IN}$) and holds the sampled voltage, or $V_{s/h}$, for $MDAC_1$ at an SHA output 80. It is noted that $V_{IN}$, $V_{s/h}$ and the residue voltage ($V_{res}$) for each MDAC 64 are self referenced (i.e., differential) and, accordingly, are each carried across a pair of conductors. Alternatively, $V_{IN}$, $V_{s/h}$ and $V_{res}$ can be single-ended and carried on a single conductor referenced to a ground.

Figure 8:
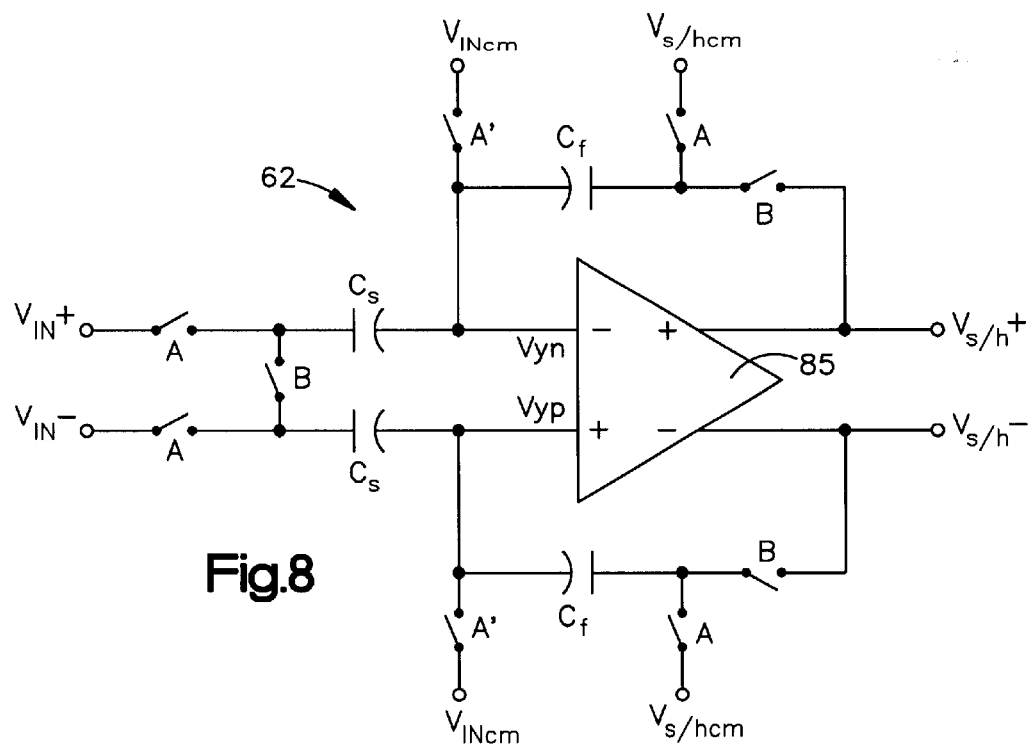
FIG. 8 is a circuit diagram of the SHA according to the present invention.

The SHA 62 has a sample clock input 82 for receiving the CLKA signal from the clock generator 70 and a hold clock input 84 for receiving the CLKB signal from the clock generator 70. The SHA 62 can be implemented with a switched capacitor circuit using a fuilly differential operational amplifier 85 as illustrated in FIG. 8. Switches A and B are implemented with CMOS transmission gates controlled by clock signals CLKA and CLKB respectively. Considered together, CLKA and CLKB form a two-phase nonoverlapping clock, the details of which will be more fuilly discussed below. Switch A' is controlled by the early falling version of CLKA, or CLKA'. The fully differential operational amplifier 85 has an input offset voltage ($V_{os}$), an input parasitic capacitance for each input node ($C_p$) and a DC differential gain ($A_o$). It is noted that the symbols cm, + and − are added to the suffixes of certain voltages in FIG. 8 and the following equations. One skilled in the art will appreciate that cm stands for common mode and that the + and − symbols distinguish between the potentials on the individual conductors of the conductor pairs for $V_{IN}$, $V_{s/h}$ and $V_{res}$. It is noted that if the accuracy requirement of the SHA 62 is not relaxed, as described herein, the capacitors in the SHA 62, labeled $C_s$ and $C_f$, need to be large enough so that the total device noise effect (i.e., KT/C noise plus opamp noise) is considerably smaller than quantization noise. In that case, 0.45 pf capacitors implemented with 20 $\mu$m×20 $\mu$m poly-poly capacitors in 0.35 $\mu$m double poly technology are used for capacitors $C_s$ and $C_f$ for a 10-bit A/D converter. However, the present invention can use smaller capacitors for $C_s$ and $C_f$. At phase B, a stable input value ($V_{ym}$) of the operational amplifier is satisfied by the following equation:

$$V_{yn} = V_{INcm} + \left(\frac{V_{s/h+} + V_{s/h-}}{2} - V_{s/hcm}\right)\left(\frac{C_f}{(C_f + C_p)}\right) - \frac{V_{os}}{2} + \frac{V_{s/h+} - V_{s/h-}}{2A_o}$$

At phase B, a stable output value of the operational amplifier is expressed by the following equation:

$$V_{s/h+} - V_{s/h-} = \frac{\left(\frac{(C_s + C_f)}{C_f}\right)(V_{IN+} - V_{IN-}) - \left(1 + \frac{C_s}{C_f} + \frac{C_p}{C_f}\right)(V_{os})}{1 + \left(\frac{1}{A_o}\right)\left(1 + \frac{C_s}{C_f} + \frac{C_p}{C_f}\right)}$$

Figure 2:
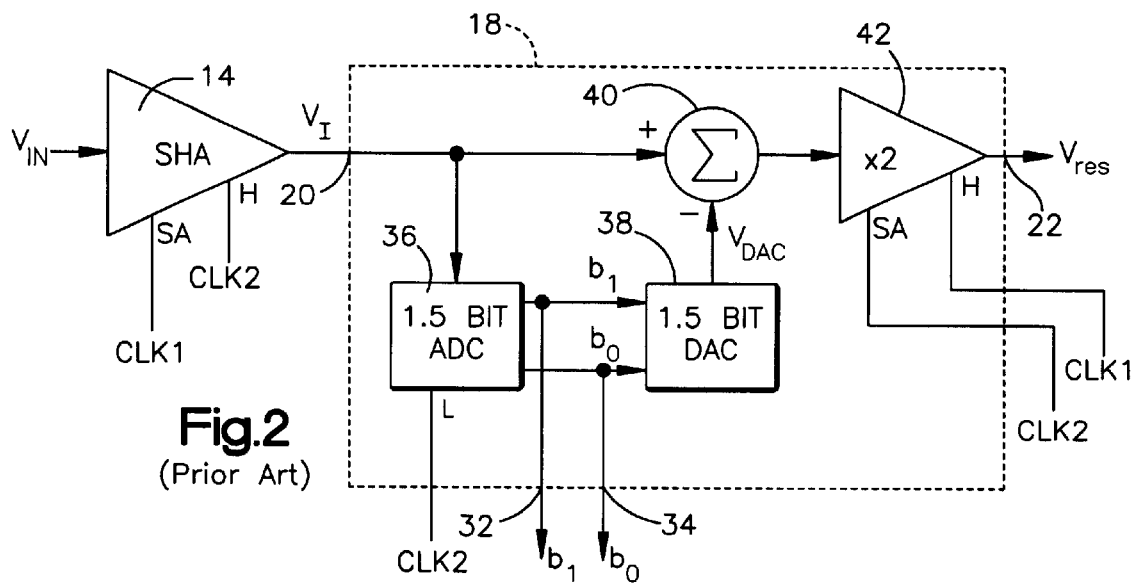
FIG. 2 is a block diagram of a conventional multiplying digital to analog converter (MDAC) representing a stage of the conventional A/D converter.
Figure 3:
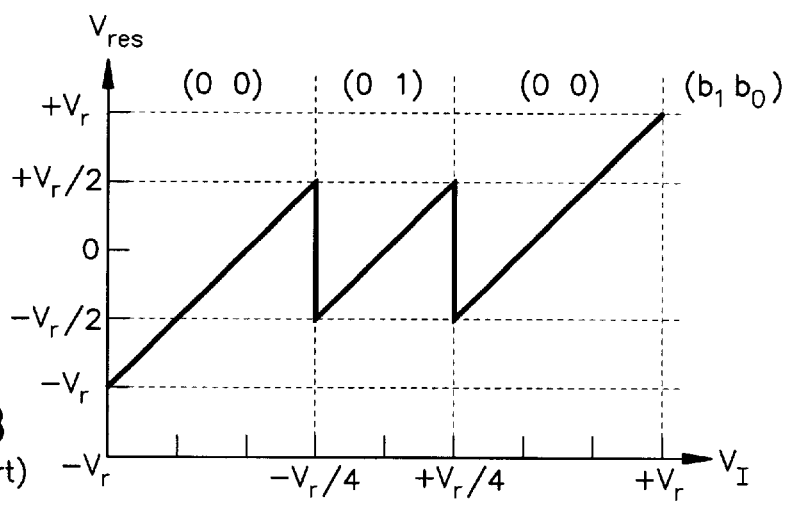
FIG. 3 is a graph of the characteristics of the MDAC illustrated in FIG. 2.
Figure 4:
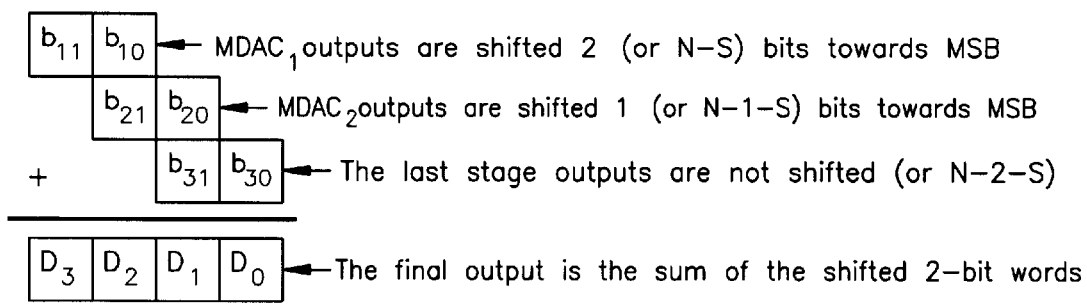
FIG. 4 is a depiction of a shifting operation of a digital error correction circuit portion of the conventional A/D converter.
Figure 5:
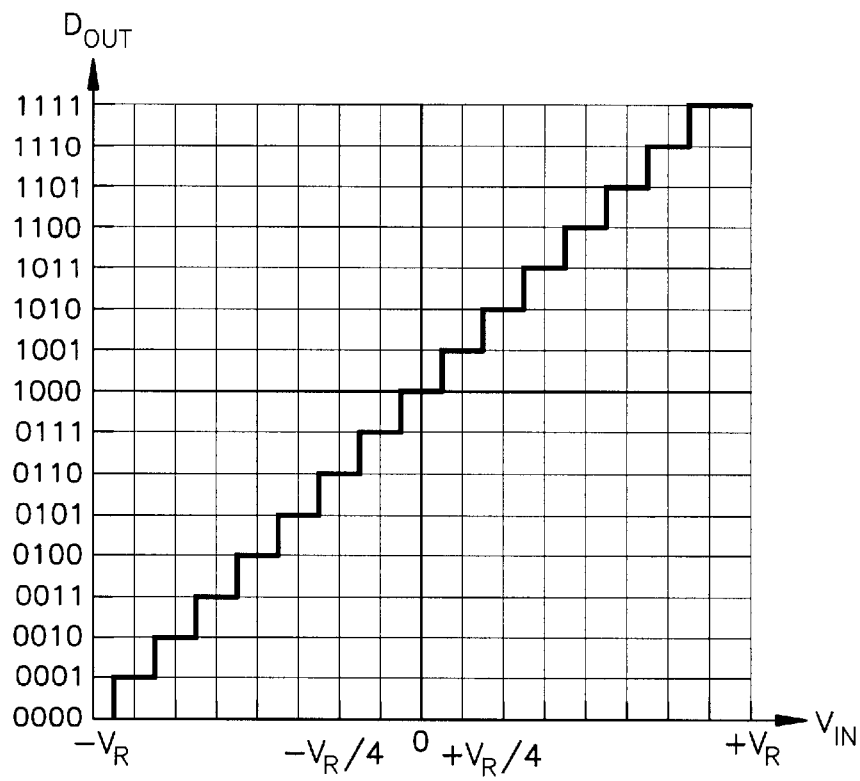
FIG. 5 is a graph of the characteristics of the A/D converter illustrated in FIG. 1.

Referring back to FIG. 7, $MDAC_1$ has an analog signal input 86 for directly receiving the analog input signal ($V_{IN}$). The analog signal input 86 is connected to an input of a residue amplifier 88 and is used to calculate the a residue signal for the $MDAC_1$, or $V_{res1}$. $MDAC_1$ is also provided with a sample-and-hold voltage input 90 connected to the SHA output 80 for receiving $V_{s/h}$. $MDAC_1$ has a flash type 1.5-bit analog to digital converter (ADC) 92 similar to the ADC 36 used for the MDAC 18 illustrated in FIG. 2. The ADC 92 has an input connected to the sample-and-hold voltage input 90 and converts $V_{s/h}$ into two bits, $b_1$ and $b_0$ in accordance with the definitions recited in TABLE 1 above. Once $b_1$ and $b_0$ are generated by the ADC 92, they are output from $MDAC_1$ to the digital logic correction circuit 68 and also input into a 1.5-bit digital to analog converter (DAC) 94. The ADC 92 has a latch clock input 96 for receiving the CLKB signal generated by the clock generator 70. The DAC 94 is similar to the DAC 38 used for the MDAC 18 illustrated in FIG. 2. The DAC 94 converts $b_1$ and $b_0$ into $V_{DAC}$ in accordance with the definitions recited in TABLE 2 above. The DAC 94 outputs $V_{DAC}$ which is received by a second input of the residue amplifier 88 for use in the calculation of $V_{res1}$. The residue amplifier is provided with a sample clock input 98 for receiving the CLKA signal and a hold clock input 100 for receiving the CLK1 signal.

Figure 9:
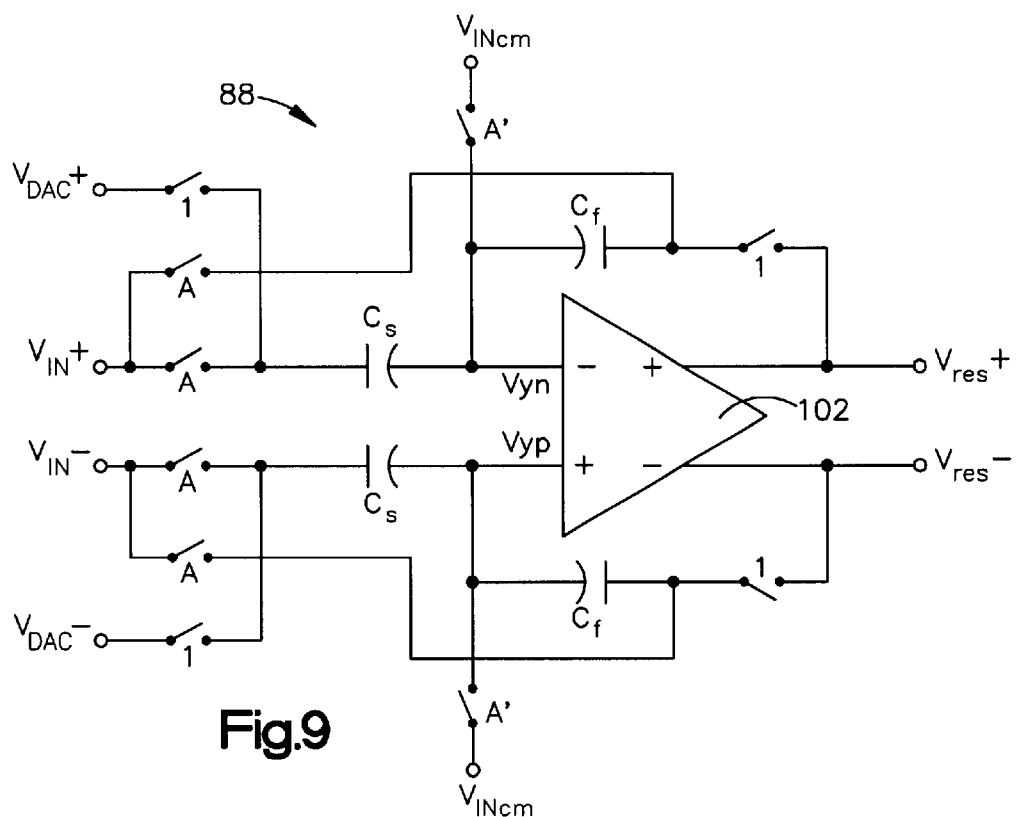
FIG. 9 is a circuit diagram of a residue amplifier portion of the first MDAC according to the present invention.

With additional to FIG. 9, the residue amplifier 88 is a differential switched capacitor voltage doubler which uses a fuilly differential operational amplifier 102. The operational amplifier 102 is preferably a telescopic opamp with a gain-enhanced cascade load to provide high gain (e.g., 80 dB) and fast settling. It is desirable that the accuracy of $V_{res1}$ for $MDAC_1$ is $\frac{1}{2}^{N-1}$ to achieve a differential non-linearity (DNL) of less than one half of a least significant bit (i.e., DNL<½LSB). It is noted that the capacitors in the residue amplifier 88, labeled $C_s$ and $C_f$, are preferably large enough so that the total device noise effect (i.e., KT/C noise plus opamp noise) is considerably smaller than quantization noise. Preferably, 0.45 pf capacitors are used for capacitors $C_s$ and $C_f$. The 0.45 pf capacitors can be implemented with 20 $\mu$m×20 $\mu$m poly-poly capacitors. Switches A and 1 are implemented with CMOS transmission gates controlled by clock signals CLKA and CLK1 respectively. Switch A' is controlled by the early falling version of CLKA, or CKLA'. The amplifier 102 has an input offset voltage ($V_{os}$) an input parasitic capacitance for each input node ($C_p$) and a DC differential gain ($A_o$). An example differential gain $A_o$ for a 10-bit A/D converter 60 is at least 4000. It is noted that the symbols cm, + and − are added to the suffixes of certain voltages in FIG. 9 and the following equations. One skilled in the art will appreciate that cm stands for common mode and that the + and − symbols distinguish between the potentials on the individual conductors of the conductor pairs for $V_{IN}$, $V_{s/h}$ and $V_{res}$. At phase 1, a stable input value ($V_{ym}$), of the amplifier 102 is satisfied by the following equation:

$$V_{yn} = V_{INcm} + X\left(\frac{C_f}{(C_s + C_f + C_p)}\right) - \frac{V_{os}}{2} + \frac{V_{res+} - V_{res-}}{2A_o}$$

where $$X = \left(\frac{C_f(V_{res+} + V_{res-})}{2} + \frac{C_s(V_{DAC+} + V_{DAC-})}{2} - \frac{(C_f + C_s)(V_{IN+} + V_{IN-})}{2}\right)$$

At phase 1, a stable output value of the amplifier 102 is expressed by the following equation:

$$V_{res+} - V_{res-} = \frac{\left(\frac{(C_s + C_f)}{C_f}\right)(V_{IN+} - V_{IN-}) - \left(1 + \frac{C_s}{C_f} + \frac{C_p}{C_f}\right)(V_{os}) + \left(\frac{C_s}{C_f}\right)(V_{DAC+} - V_{DAC-})}{1 + \left(\frac{1}{A_o}\right)\left(1 + \frac{C_s}{C_f} + \frac{C_p}{C_f}\right)}$$

Referring back to FIG. 7, $MDAC_1$ uses $V_{s/h}$ only to generate $b_{11}$ and $b_{10}$ and not directly in the calculation of $V_{res1}$. Rather, the $MDAC_1$ directly uses the analog input signal $V_{IN}$ in the calculation of the residue value $V_{res1}$. The SHA 62 no longer requires the analog voltage equivalent of N-bit accuracy, or a tolerance of one LSB, since the SHA 62 stage is removed from the residue generation process. The accuracy requirement for $V_{s/h}$ is relaxed from the difficult to achieve analog voltage equivalent of N-bit resolution to a tolerance correctable using the digital logic correction circuit. Therefore, the accuracy, or tolerance, of the SHA 62 stage can be expressed as being an error which is less than $V_r/4$, where Vr is the full scale range of the ADC 92 of $MDAC_1$. It is noted that full scale range of the ADC 92 of $MDAC_1$ is commensurate with the full scale range of $V_{IN}$. Therefore, the tolerance of the SHA 62 is ±25% of $V_{IN}$, or alternatively expressed as a voltage output accuracy of an analog voltage equivalent of N-1 bits. As one skilled in the art will appreciate, reducing the accuracy required of the SHA 62 provides certain advantages. It greatly reduces the need for fast settling times in the SHA 62, making the design of the SHA 62 is easier to implement. Also, the SHA 62 can be implemented with a circuit having reduced power consumption and chip area.

Figure 10:
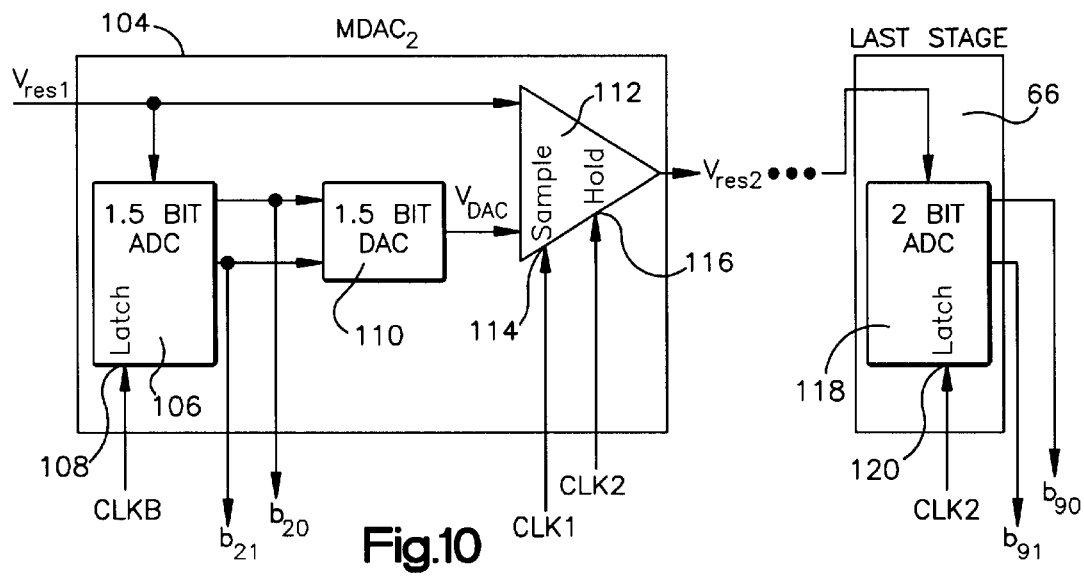
FIG. 10 is a block diagram of a second MDAC and a last stage according to the present invention.

Referring to FIG. 10, a second MDAC, or $MDAC_2$ (reference numeral 104), and the last stage 66 are illustrated. The $MDAC_2$ is operationally the same as the MDAC 18 (FIG. 2) found in the A/D converter 10 illustrated in FIG. 1. In addition, all of the MDACs 76 after the first MDAC, or $MDAC_1$, are identical with the exception of the input clock waveforms applied to the MDACs 76 to establish the timing. The clock signals applied to the various stages is discussed in more detail below. Therefore, discussion of the MDACs 76 in the pipeline subsequent to $MDAC_1$, will be limited to the following discussion of $MDAC_2$. $MDAC_2$ provides a flash type 1.5-bit ADC 106 having two comparators and a latch clock input 108. The ADC 106 converts the residue voltage, $V_{res}$, of the prior MDAC 64 into two output bits $b_{m1}$ and $b_{m0}$ as discussed above. The output bits $b_{m1}$ and $b_{m0}$ are input into the digital error correction circuit for calculation of the digital output, $D_{OUT}$. The output bits $b_{m1}$ and $b_{m0}$ are also input into a 1.5-bit DAC 110 provided by the $MDAC_2$ for generating $V_{DAC}$ as discussed above. The $MDAC_2$ provides a residue amplifier 112 which is substantially the same as the residue amplifier 88 for $MDAC_1$. The residue amplifier 112 calculates a residue voltage, $V_{resm}$, for the next stage of the A/D converter 60 using the residue voltage of the prior stage and $V_{DAC}$ as discussed above. The residue amplifier 112 has a sample clock input 114 and a hold clock input 116.

With continued reference to FIG. 10, the last stage 66 is operationally the same as the last stage 30 (FIG. 1) for the A/D converter 10. The last stage 66 provides a flash type 2-bit ADC 118 having three comparators and a latch clock input 120. The ADC 118 converts the residue voltage, $V_{res}$, of the prior MDAC 64 into two output bits $b_{m1}$ and $b_{m0}$ as discussed above. The output bits $b_{m1}$ and $b_{m0}$ are input into the digital error correction circuit for calculation of the digital output, $D_{OUT}$.

Figure 11:
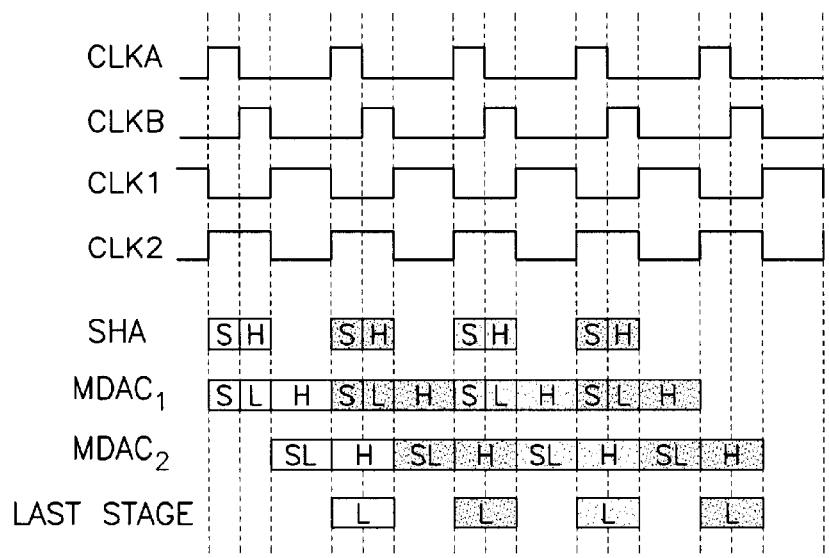
FIG. 11 is a timing diagram of a 4-bit pipeline A/D converter according to the present invention.
Figure 13:
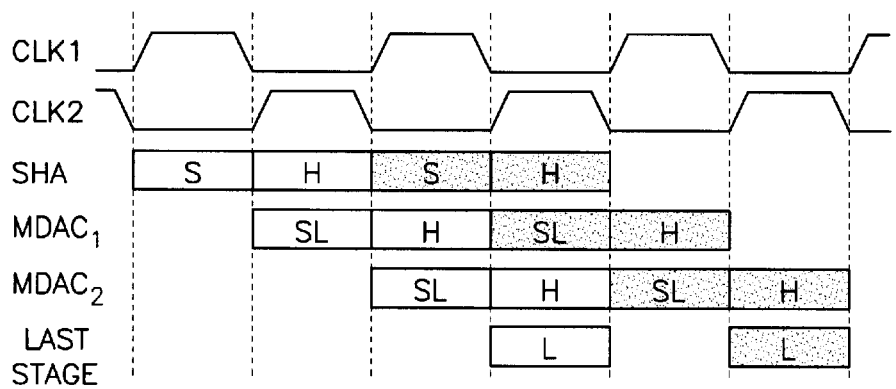
FIG. 13 is a timing diagram of the A/D converter illustrated in FIG. 1.

Referring now to FIG. 11, the timing of an example 4-bit A/D converter constructed in accordance with the present invention will now be described. Similar to the 10-bit A/D converter illustrated in FIG. 6, the example 4-bit A/D converter has the SHA stage 62, the first $MDAC_1$, the second $MDAC_2$, and the last stage 46, but does not have the additional six intermediate MDAC stages 76, or $MDAC_3$ through $MDAC_8$. The timing of a 4-bit A/D converter, rather than a higher resolution A/D converter, is described for simplicity and clarity. The same timing is used for a higher N-bit converter, but the clock phase for the sample and hold of the third and 10 subsequent MDACs 76 alternate from stage to stage. More specifically, the third and subsequent MDACs 76 alternately use CLK1 and CLK2 for the sample/latch operation and the hold operation so that the sample/latch of the MDAC 64 coincides with the hold of the previous MDAC 76, as is illustrated for $MDAC_1$ and $MDAC_2$ in FIGS. 11 and 13.

Waveforms for the four clock pulses, CLKA, CLKB, CLK1 and CLK2 are illustrated in the top portion of FIG. 11. Considered together, CLKA and CLKB form a two-phase nonoverlapping clock. CLKA effectively has about a 25% duty cycle. CLKB also effectively has about a 25% duty cycle but lags CLKA by 90°. Considered together, CLK1 and CLK2 form a two-phase nonoverlapping clock. CLK1 effectively has about a 50% duty cycle but lags CLKA by 180°. CLK2 also effectively has about a 50% duty cycle but lags CLK1 by 180°. It is noted that for simplicity and clarity, the four clock pulse signals are shown in FIG. 11 as square waves. However, the clock pulses preferably have sloping leading and falling edges as illustrated for the clock signals shown in FIG. 13.

The sample, hold and latch operations of the SHA stage 62, the first $MDAC_1$, the second $MDAC_2$, and the last stage 66 are illustrated in the bottom portion of FIG. 11. The different shading in the timing diagram represents the pipeline conversion process on a series of four analog input samples as the samples pipeline through all of the stages.

The SHA 62 samples the analog input signal, $V_{IN}$, during CLKA and conducts a hold operation during CLKB. Therefore, the SHA 62 produces $V_{s/h}$ within an acceptable tolerance by the end of the pulse of CLKB. In other words, $V_{s/h}$ has settled to the analog equivalent of N-1 bit accuracy within a half of a duty cycle.

Using $V_{s/h}$, the ADC 92 of $MDAC_1$ operates and generates its digital output, $b_{11}$ and $b_{10}$, during the pulse of CLKB. Preferably, the ADC 92 latches the digital output on the falling edge of CLKB, thereby giving $V_{s/h}$ the maximum possible time to settle. It should be appreciated that the latch operation of $MDAC_1$ is thereby accomplished within a half of a duty cycle.

Simultaneously to the sampling conducted by the SHA 62, $MDAC_1$ also samples the input signal, $V_{IN}$, during CLKA. This is done to allow all of the stages to convert the same sample of $V_{IN}$ at the appropriate time so that the respective output bits of each stage, $b_1$ and $b_0$, are cascaded to the digital logic correction circuit 72 at the correct time to be combined together to produce a digital output signal, $D_{OUT}$, for the same input sample.

$MDAC_1$ generates and holds the residue output $V_{res1}$ during CLK1. $MDAC_2$ samples $V_{res1}$ during CLK1 and latches its digital output at the end of CLK1, preferably on the falling edge of CLK1, thereby giving $V_{res1}$ time to settle to N-1 bit accuracy. $MDAC_2$ generates and holds $V_{res2}$ during CLK2. The last stage 66 latches its digital output at the end of CLK2, or on the falling edge of CLK2, thereby giving $V_{res2}$ time to settle to N-2 bit accuracy. The last stage 66 does not conduct sample and/or hold operations since the last stage 66 does not generate a residue output. It should be appreciated that the overall conversion of a sample of $V_{IN}$ to $D_{OUT}$ is advanced by a half duty cycle in the A/D converter 60 as compared to the conventional A/D converter 10. Therefore, the A/D converter 60 derives a $D_{OUT}$ for each sampled $V_{IN}$ faster than the A/D converter 10. For example, a four bit A/D converter 60 according to the present invention is 25% faster that a conventional four bit A/D converter 10 since the four bit A/D converter 60 according to the present invention converts a $V_{IN}$ sample in 1.5 clock cycles and the four bit conventional A/D converter converts a $V_{IN}$ sample in two clock cycles.

The A/D converter 60 of the present invention is well suited for use in a variety of applications. For instance, the A/D converter 60 can be used as part of a memory circuit. In addition, the A/D 60 converter can be implemented with discrete components or as part of an integrated circuit. If the A/D converter 60 is implemented as part of an integrated circuit, the A/D converter 60 can be made using known integrated circuit manufacturing technology in a medium such as 0.35 μm CMOS.

Figure 12:
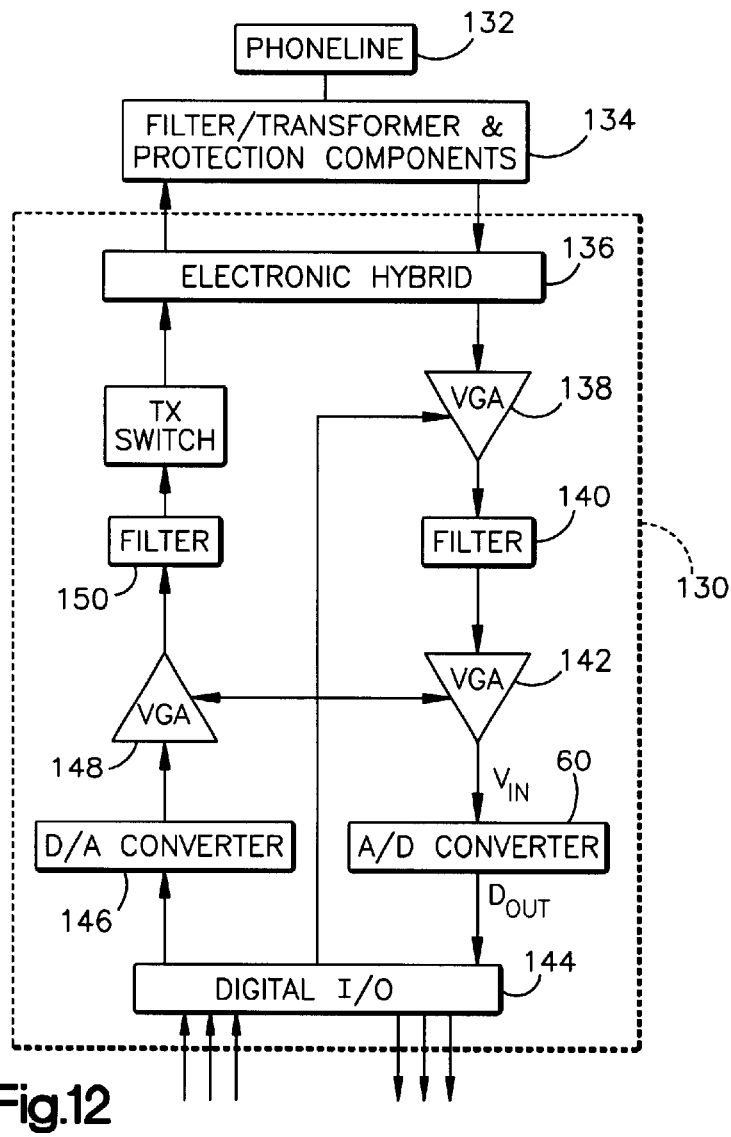
FIG. 12 is a block diagram of an analog front end circuit having the A/D converter according to the present invention.

As another example application, the A/D converter 60 can be used as part of an analog front end circuit 130 (FIG. 12), or physical layer, of a networking device, such as a 10Mbps or higher bandwidth in-home network data network operating over a conventional RJ11 telephone line 132. Referring to FIG. 12, the analog front end circuit 130 receives data signals from the telephone line 132 via a circuit 134 having components to condition the data signals, such as filters, transformers and surge protection. The received signals are processed by an electronic hybrid circuit 136 to perform functions such as collision detection. Next, the received signals are passed through a first variable gain amplifier (VGA) 138, a filter 140 and a second VGA 142 to further condition the received signals. The conditioned received signal is input into the A/D converter 60 as $V_{IN}$. As described in more detail above, the A/D converter 60 converts the analog input signal, $V_{IN}$, into a digital output, $D_{OUT}$. In this application, $V_{IN}$ is preferably sampled at 25 to 50 Msample/s and $D_{OUT}$ preferably has 10 to 12 bits. DOUT is then sent from the A/D converter 60 to a digital input/output (I/O) circuit 144. The digital I/O circuit 144 acts as an interface between the analog front end circuit 130 a subsequent network device circuit, such a circuit to implement the data link layer of an open systems interconnection (OSI) protocol stack.

Digital data output signals received from the subsequent network device circuit by the analog front end circuit 130 are received by the digital I/O circuit 144. The digital data output signals are converted into a transmit analog signal by a digital to analog (D/A) converter 146. The transmit analog signal is conditioned by a third VGA 148. The third VGA 148 acts as an adjustable gain transmit attenuator to allow for flexibility in setting the transmit power of the analog front end circuit 130. The attenuated transmit signal is further conditioned by a filter 150. The filtered, attenuated transmit signal is optionally passed through a transmit switch before being sent to the telephone line 132 through the electronic hybrid circuit 136 and the circuit 134.

Although particular embodiments of the invention have been described in detail, it is understood that the invention is not limited correspondingly in scope, but includes all changes, modifications and equivalents coming within the spirit and terms of the claims appended hereto.

What is claimed is:

1. A pipeline analog to digital converter for converting an analog input signal into a digital representation of the analog signal comprising:
    a sample and hold stage, the sample and hold stage sampling and holding the analog input signal input to the sample and hold stage and outputting a sampled and held signal;
    a first analog signal converter stage, the first analog converter stage producing a digital output based on the sampled and held signal, at least a most significant bit of the digital representation of the analog input signal being derived from the digital output, and the first analog converter stage producing a residue signal based on a comparison of the analog input signal, which has not been sampled and held by the sample and hold stage and an analog representation of the digital output; and
    at least one additional stage, the additional stage producing a subsequent digital output based on the residue signal produced by the first analog signal converter stage, at least one bit which is less significant than the most significant bit being derived from the subsequent digital output.

2. The pipeline analog to digital converter according to claim 1, wherein the additional stage is a second analog signal converter stage, the second analog signal converter stage producing a second residue signal, the second residue signal based on a comparison of the residue signal of the first analog signal converter stage and an analog representation of the subsequent digital output.

3. The pipeline analog to digital converter according to claim 2, further comprising a last stage, the last stage converting the second residue signal into a last stage digital output, a least significant bit being derived from the last stage digital output.

4. The pipeline analog to digital converter according to claim 3, further comprising a digital logic correction circuit, the digital logic correction circuit combining the digital outputs of the first and second analog signal converter stages and the last stage to generate the digital representation of the analog input signal.

5. The pipeline analog to digital converter according to claim 1, wherein the additional stage is a last stage.

6. The pipeline analog to digital converter according to claim 1, further comprising a digital logic correction circuit, the digital logic correction circuit combining the digital outputs of the first analog converter stage and the additional stage to generate the digital representation of the analog input signal.

7. The pipeline analog to digital converter according to claim 1, wherein the sample and hold stage has a tolerance of ±25% of the analog input signal.

8. The pipeline analog to digital converter according to claim 1, wherein pipeline analog to digital converter is used as part of a front end circuit for a data networking device and the analog input signal is an incoming data signal received over a telephone line.

9. A pipeline analog to digital converter comprising;
    a sample and hold stage, the sample and hold stage having an input and an output, the sample and hold stage input connected to receive an analog input signal; and
    an analog signal converter stage, the analog signal converter stage having a sample-and-hold voltage input, an analog signal input, a digital output, and a residue output, wherein the sample-and-hold voltage input is connected to the output of the sample and hold stage and the analog signal input is directly connected to receive the analog input signal, the analog input signal being used to generate a residue output signal.

10. The pipeline analog to digital converter according to claim 9, wherein the analog signal converter stage has an analog to digital converter, a digital to analog converter and a residue amplifier, the analog signal input connected to a first input of the residue amplifier, the sample-and-hold voltage input connected to an input of the analog to digital converter, the digital output and an input of the digital to analog converter connected to the an output of the analog to digital converter, an output of the digital to analog converter connected to a second input of the residue amplifier, and the residue output connected to an output of the residue amplifier.

11. The pipeline analog to digital converter according to claim 10, wherein the residue amplifier is a differential switched-capacitor voltage doubler having a differential operational amplifier.

12. The pipeline analog to digital converter according to claim 10, wherein the analog to digital converter of the analog signal converter stage is at least a 1.5-bit flash-type analog to digital converter.

13. The pipeline analog to digital converter according to claim 9, further comprising a second analog signal converter stage, the second analog signal converter stage having an input, a digital output and a residue output, the input of the second analog signal converter stage connected to the residue output of the analog signal converter stage.

14. The pipeline analog to digital converter according to claim 13, further comprising a last stage, the last stage having an input and a digital output, the input of the last stage connected to the residue output of the second analog signal converter stage.

15. The pipeline analog to digital converter according to claim 14, further comprising a digital logic converter circuit, the digital logic converter circuit having a series of digital inputs and a cumulative digital output, the digital inputs respectively connected to the digital outputs of the analog signal converter stage, the second analog signal converter stage and the last stage, the cumulative digital output providing a digital representation of the analog input signal.

16. The pipeline analog to digital converter according to claim 9, wherein the sample and hold stage has a tolerance of ±25% of the analog input signal.

17. The pipeline analog to digital converter according to claim 9, wherein the pipeline analog to digital converter is used as part of a front end circuit for a data networking device and the analog input signal is an incoming data signal received over a telephone line.

* * * * *

UNITED STATES PATENT AND TRADEMARK OFFICE
CERTIFICATE OF CORRECTION

PATENT NO.   : 6,295,016 B1
DATED        : September 25, 2001
INVENTOR(S)  : Meei-Ling Chiang It is certified that error appears in the above-identified patent and that said Letters Patent is hereby corrected as shown below:

Column 1,
Line 17, replace "Oftentimes, a conventional" with -- Oftentimes, conventional --.

Column 3,
Line 14, replace "pipeline AID converter" with -- pipeline A/D converter --.
Line 35, replace "Waveformns" with -- Waveforms --.
Line 53, replace "converter IO, the third" with -- converter 10, the third --.

Column 7,
Line 3, replace "a fuilly differential" with -- a fully differential --.

Column 9,
Line 53, replace "third and 10 subsequent" with -- third and subsequent --.

Signed and Sealed this

Fourth Day of June, 2002

Attest:

JAMES E. ROGAN
Attesting Officer          Director of the United States Patent and Trademark Office